United States Patent [19]
Kweon

[11] Patent Number: 6,035,427
[45] Date of Patent: Mar. 7, 2000

[54] CONVOLUTIONAL INTERLEAVER AND METHOD FOR GENERATING MEMORY ADDRESS THEREFOR

[75] Inventor: Oh Sang Kweon, Seoul, Rep. of Korea

[73] Assignee: Daewoo Electronics Co., Ltd., Seoul, Rep. of Korea

[21] Appl. No.: 08/886,514

[22] Filed: Jul. 1, 1997

[30] Foreign Application Priority Data

Jul. 1, 1996 [KR] Rep. of Korea ................. 96-26592

[51] Int. Cl.[7] ............... G06F 12/00; G06F 5/00; G06F 9/00; G06F 11/00
[52] U.S. Cl. ............... 714/702; 714/701; 714/728; 711/200; 711/202
[58] Field of Search .................. 711/202, 200; 371/2.1, 10.2, 22.33, 22.35, 27.2, 37.5, 38.1, 39.1, 44; 714/701, 702, 728

[56] References Cited

U.S. PATENT DOCUMENTS 5,042,033  8/1991  Costa .
5,537,420  7/1996  Huang .

FOREIGN PATENT DOCUMENTS

0660558A2  12/1994  European Pat. Off. .
0681373A2  5/1995   European Pat. Off. .
0681373A3  5/1995   European Pat. Off. .
2039193    11/1979  United Kingdom .
WO95/18489 7/1995   WIPO .

*Primary Examiner*—Eddie P. Chan
*Assistant Examiner*—Kimberly McLeon
*Attorney, Agent, or Firm*—Pillsbury Madison & Sutro LLP

[57] ABSTRACT

A convolutional interleaver for interleaving a data stream composed of N number of data with predetermined interleaving level B to randomize the data stream for an error correction, comprising: an input buffer; a memory; an address generating unit; an output buffer; and a controller, and a method for generating an address of the memory are disclosed. In the method for generating an address of the memory, a basic memory of which the number of vertical end is B−1 and horizontal length is (B−1)×M cell is transformed to an intermediate memory of which the number of vertical end is B−1 and horizontal length is (B/2)×M cell, and a physical address for accessing the intermediate memory is generated. The physical address is maintained during one clock period, while the memory reads the previous data stored in the memory position corresponding to the physical address during the first half period of the clock and stores the current input data in the same memory position corresponding to the physical address during the latter half period of the clock.

8 Claims, 5 Drawing Sheets

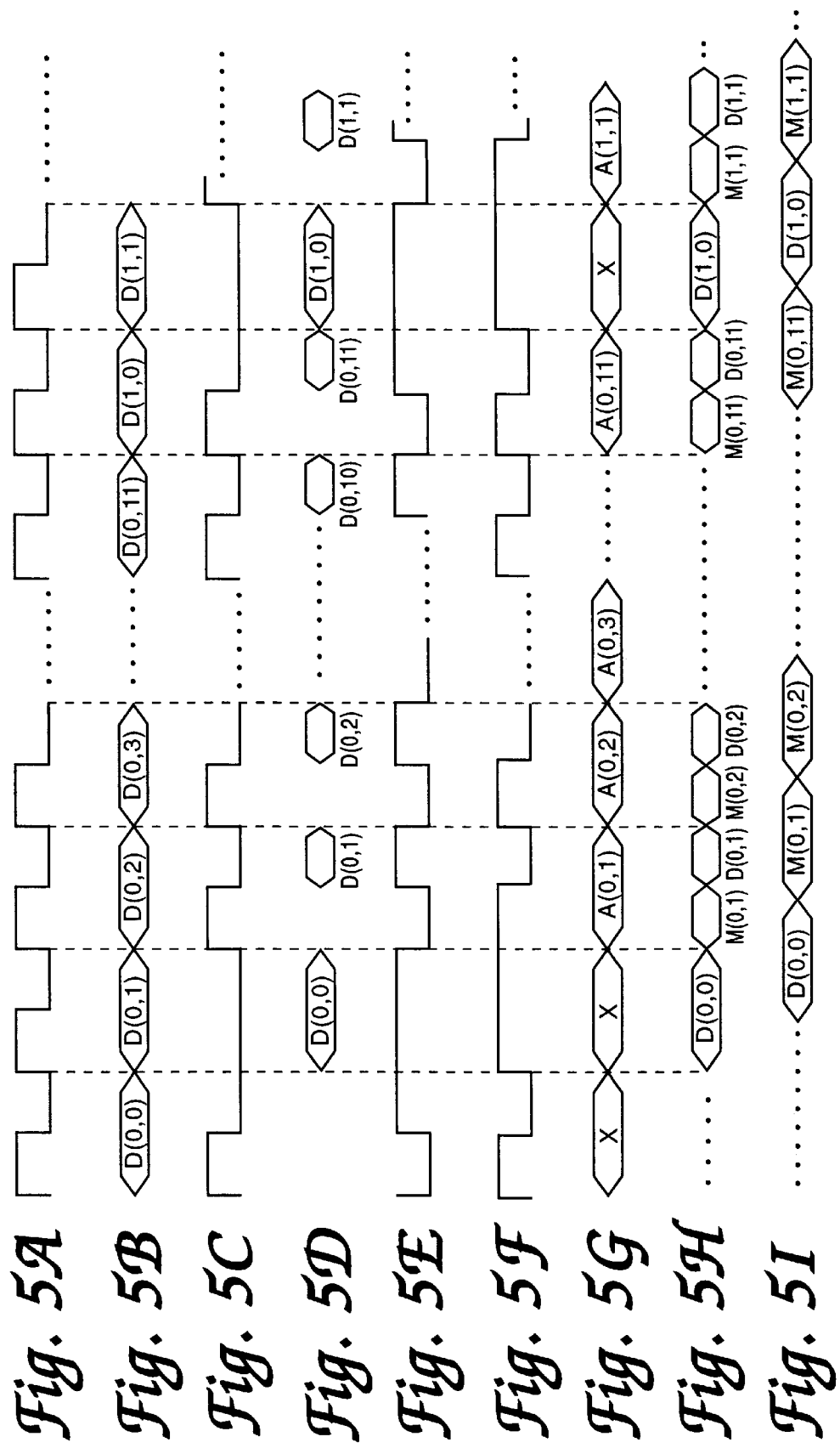

CONVOLUTIONAL INTERLEAVER AND METHOD FOR GENERATING MEMORY ADDRESS THEREFOR

BACKGROUND OF THE INVENTION

1. Field of the Invention

The present invention relates to a channel encoder of digital communication system, and more particularly to a convolutional interleaver and method for generating a memory address for reducing the effect of burst errors during data transmission by randomizing an input data stream.

2. Description of the Prior Art

Generally, in a digital communication system, an error correcting technology has been commonly used for detecting and correcting the errors generated during data transmission. The error correcting technology is mainly composed of an error correcting coding (ECC) process in which parity data is added to the transmitted information data at the transmitting end and an interleaving process for rearranging the ordering of coded data to spread apart consecutive errors. When a block code such as Reed-Solomon code out of error correcting codes is employed, information data is divided into a plurality of blocks and redundancy bits are added thereto for detecting and correcting errors in units of block. When a non-block code such as convolutional code is employed, coding is performed according to input sequence and the coded current data is affected by the previous data, which results in better error correcting capabilities than the block code. In the interleaving process, the ordering of data stream coded with either convolutional code or Reed-solomon code is rearranged in a deterministic manner so that the effect of burst errors can be efficiently reduced.

In general, in the digital communication system, the error generated during data transmission is classifed into two types: random errors which are spread apart, and burst errors which comprise a large number of consecutive errors. The error correcting coding (ECC) has an excellent correcting capability for the random errors, however, it is ineffective in presence of burst errors. Accordingly, in most of digital communication systems, an interleaver is equipped for rearranging the original data stream to spread apart the burst errors at the transmitting end, and at least one deinterleaver for recovering the rearranged data stream into the original data stream is provided at the receiving end.

There are two kinds of interleavers a block interleaver and a convolutional interleaver. The block interleaver interleaves the data stream in block units (K×L), consisting of K rows and L columns and randomizes the data stream by varying the input/output sequence. That is, the input data stream is horizontally scanned to be stored in a memory and the data stored in the memory is vertically scanned to be outputted. As a result, a bit stream with interleaving level L is inserted between two adjacent data. That is, in the block unit (K×L), K is codeword length and L is interleaving level.

In the convolutional interleaver, the input data is temporarily in the memory for a predetermined delay, and the delayed data are inserted between two adjacent data.

FIG. 1 is a diagram illustrating a concept of convolutional interleaver and deinterleaver. The convolutional interleaver 10 is composed of an input switch 11, a plurality of shift registers (I-0) through I-(B−1), and an output switch 12. The convolutional deinterleaver 15 is composed of an input switch 16, a plurality of shift registers D-(B−1) through (D-0), and an output switch 17. Here, data is inputted/outputted to and from the convolutional interleaver 10 and the convolutional deinterleaver 15 in byte units.

The convolutional interleaver has the structure that in the first shift register (I-0), the input and the output are directly connected, such that the length of the shift register is 0, and from the next shift register I-1 to the last shift register I-(B−1) the length of the shift register is M, 2M, 3M, ..., (B−1)M, such that the length difference between adjacent shift registers is M byte. The convolutional deinterleaver has the inverse structure of the convolutional interleaver.

In (B, M) convolutional interleaver, B indicates the number of the vertical ends of the shift registers, which is called the interleaving level, and M indicates the length difference between the adjacent shift registers.

In the convolutional interleaver 10, the input switch 11 operates in synchronization with the output switch 12, and sequentially switches from the shift register I-0 to the shift register I-(B−1) with B period. According to the switching operation, the first data of B period inputted to the shift register I-0 is outputted without delay, and the second to the last data of B period inputted to the shift registers I-1 to I-(B−1) is outputted after BM, 2BM, ..., (B−1)BM delay, respectively. Consequently, at the transmitting end, BM number of arbitrary data are inserted between two adjacent data of the input data stream to be transmitted via the channel 13.

In the convolutional deinterleaver 15, the input switch 16 operates in synchronization with the output switch 17 in the same manner as the convolutional interleaver 10. That is, according to the switching operation, the first to the last data of B period inputted to the shift registers D-(B−1) to D-1 is outputted after (B−1)BM, (B−2)BM, ..., BM delay, and the last data of B period inputted to the shift register D-0 is outputted without delay. Consequently, at the receiving end, after (B−1)BM clock delay, the original data stream is obtained.

The minimal amount of memory (Smin) required for the convolutional interleaver is given by the following mathematical expression 1.

MATHEMATICAL EXPRESSION 1

$$Smin = \frac{M \times B \times (B-1)}{2} \text{(bytes)}$$

Here, B is the interleaving level, and M is the length difference between the adjacent shift registers.

In the convolutional interleaver, when the shift register such as the First-In First-Out (FIFO) buffer is employed as a memory, a vast storage capacity is required. Therefore, the random access memory (RAM) is used instead to avoid complexity and to decrease hardware size of the interleaver.

However, in the convolutional interleaver using the RAM as its memory, the hardware size is reduced, but the address control logic for controlling the memory is needed to enhance the efficiency of its operation. Therefore, there is a need for a method capable of performing an accurate convolutional interleaving with the existing memory capacity.

SUMMARY OF THE INVENTION

Accordingly, it is an object of the present invention to provide a convolutional interleaver and a method for generating a memory address to optimize the memory capacity and reduce the hardware size of the interleaver.

In order to achieve the above object, the present invention provides a convolutional interleaver for interleaving a data stream composed of N number of consecutive data with an interleaving level B to randomize the data stream for error correction, comprising: input means for inputting the data stream and outputting a first data of the interleaving level during a first clock and a second to a Bth data of the interleaving level during one half period of a second to a Bth clock, respectively; storage means having a structure of an intermediate memory having B−1 number of vertical ends with a horizontal cell length of (B/2)×M modified from a structure of a basic memory having B−1 number of vertical ends with a horizontal cell length of (B−1)×M by moving some of used storage locations into all of unused storage locations in the basic memory, where M=N/B, for being performed a read operation and a write operation during one and the other half period of a clock for which a physical address is maintained, respectively; address generating means for generating the physical address to access the intermediate memory; output means for outputting the data from the input means during the first clock and the data from the storage means during each of a second to a Bth clock, respectively; and a controller for receiving a basic vertical address from the address generating means and generating a plurality of control signals for controlling the input means, the output means, and the storage means.

In order to achieve the above object, the present invention provides a method for generating a memory address to interleave a data stream composed of N number of consecutive data with an interleaving level B, comprising the steps of; (a) disabling a memory access in a first clock of the interleaving level for a first data of B period; (b) generating a basic vertical address for selecting one of (B−1) number of vertical ends in a basic memory having B−1 number of vertical ends with a horizontal length cell of (B−1)×M to delay the remaining data except the first data of B period, a basic horizontal group address for selecting one of (B−1) number of horizontal groups in the basic memory, and a horizontal cell address for selecting one of M number of cells in one of the horizontal groups in the basic memory, where M=N/B; (c) converting the basic vertical address in the (b) step to an intermediate vertical address for selecting one of (B−1) number of vertical ends of an intermediate memory having B−1 number of vertical ends with a horizontal length cell of (B/2)×M, and the basic horizontal group address in the (b) step to an intermediate horizontal group address for selecting one of (B/2) number of the horizontal groups of the intermediate memory; (d) generating a physical address for accessing the intermediate memory by using the intermediate vertical address and intermediate horizontal group address in the (c) step, and the horizontal cell address in the (b) step; and (e) maintaining the physical address in the (d) step during one clock while reading the data during one half period of the clock and writing the data during the other half period of the clock.

BRIEF DESCRIPTION OF THE DRAWINGS

The present invention will be better understood and its various objects and advantages will be more fully appreciated from the following description taken in conjunction with the accompanying drawings, in which:

FIG. 5A to FIG. 5I are timing diagrams showing the operation of a convolutional interleaver shown in FIG. 2.

DESCRIPTION OF THE PREFERRED EMBODIMENT

Reference will now be made in detail to the present invention, examples of which are illustrated in the accompanying drawings. Wherever possible, the same reference numbers will be used throughout the drawings to refer to the same or like parts.

Figure 2:
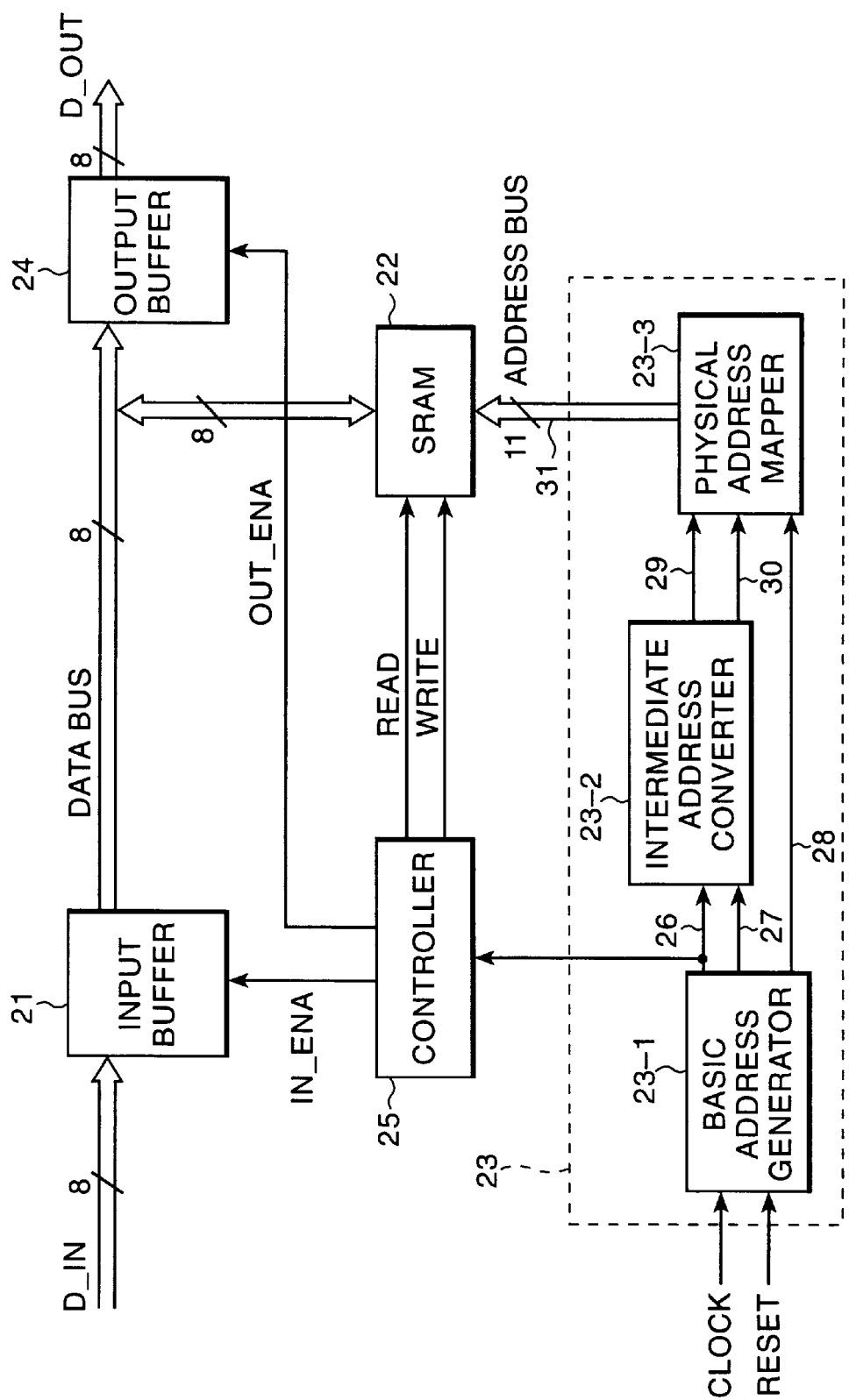
FIG. 2 is a block diagram of a convolutional interleaver in accordance with the present invention.

FIG. 2 is a block diagram of a convolutional interleaver in accordance with the present invention. The convolutional interleaver comprises an input buffer 21, a static random access memory (SRAM) 22, an address generating unit 23, an output buffer 24, and a controller 25. The address generating unit 23 comprises a basic address generator 23-1, an intermediate address converter 23-2, and a physical address mapper 23-3.

The memory in the present invention is realized by a static random access memory (SRAM), however, it can be substituted by other various types of memory.

Figure 1:
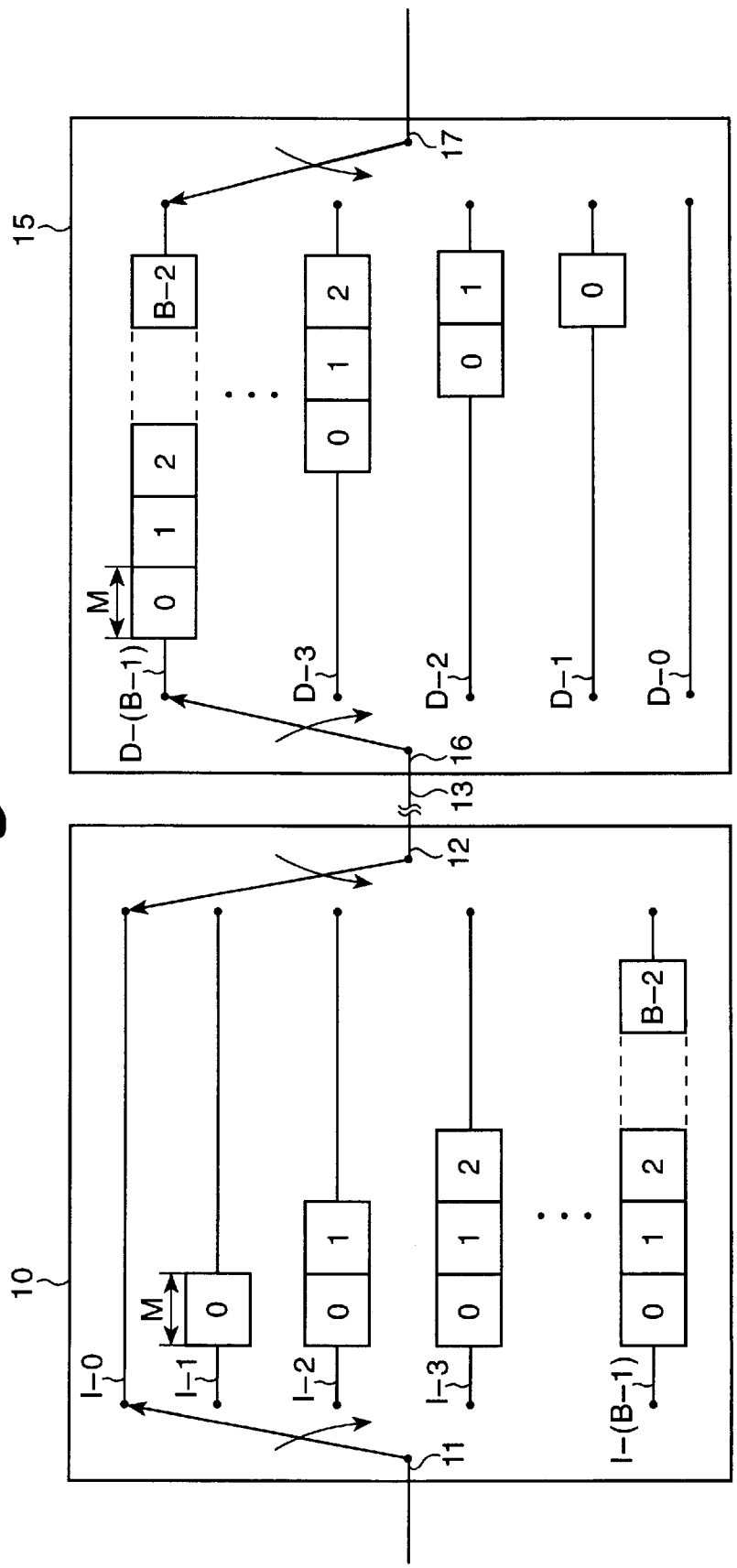
FIG. 1 is a diagram illustrating shift registers of a convolutional interleaver and deinterleaver used for explaining the operations of convolutional interleaver and deinterleaver of a present invention and prior art.
Figure 3A:
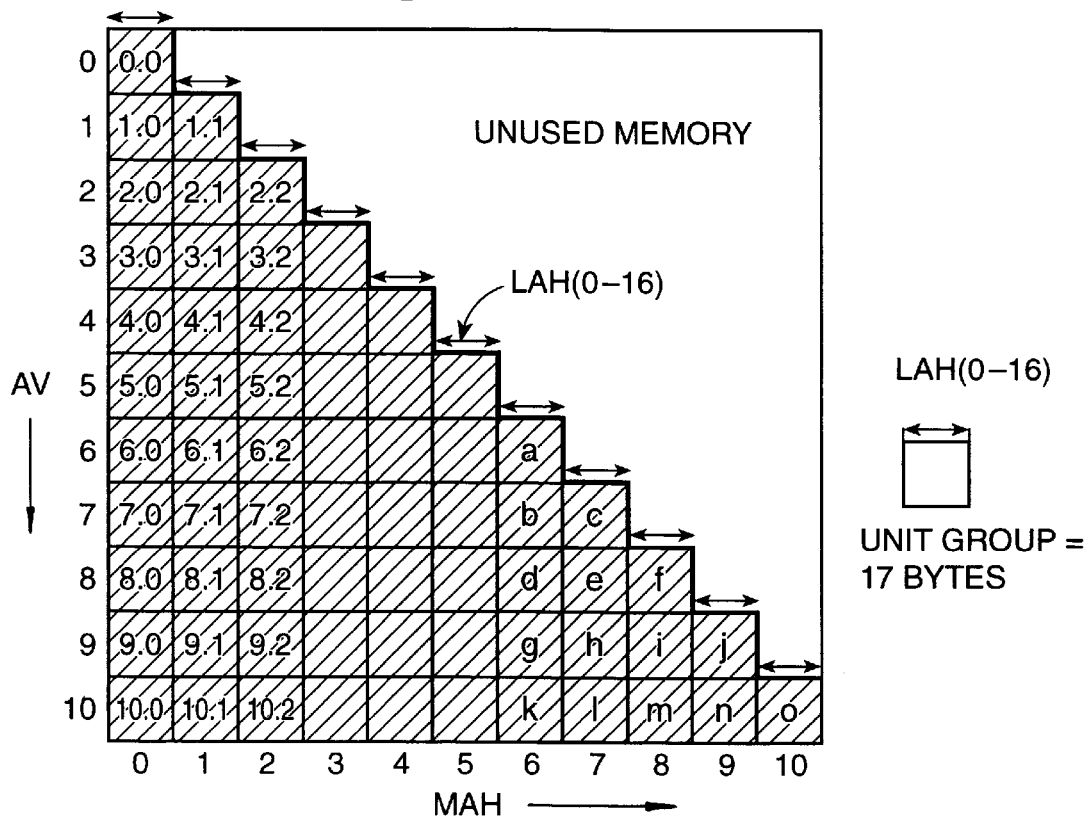
FIG. 3A is a diagram illustrating a memory mapping in accordance with the basic address generated from an address generating unit in FIG. 2.

FIG. 3A shows that the arrangement of memory cells according to the basic address in (12,17) convolutional interleaver is the same as that of the shift registers I-1 to I-(B−1) except the shift register I-0 in the interleaver of FIG. 1. In this mapping diagram, the basic vertical address AV zero (0) to 10 is to select one of the vertical ends of the memory, and the basic horizontal group address MAH zero (0) to 10 and the horizontal cell address LAH zero (0) to 16 are to select one of the horizontal memory cells. That is, MAH indicates one of 11 register groups, each of which comprises 17 consecutive registers, and LAH indicates one of the 17 consecutive registers in the register group selected by MAH.

According to the mapping of the basic addresses in FIG. 3A, only 66 of possible 121 register groups (=11×11) are used, which results in a waste of memory by unused 55 register groups.

Figure 3B:
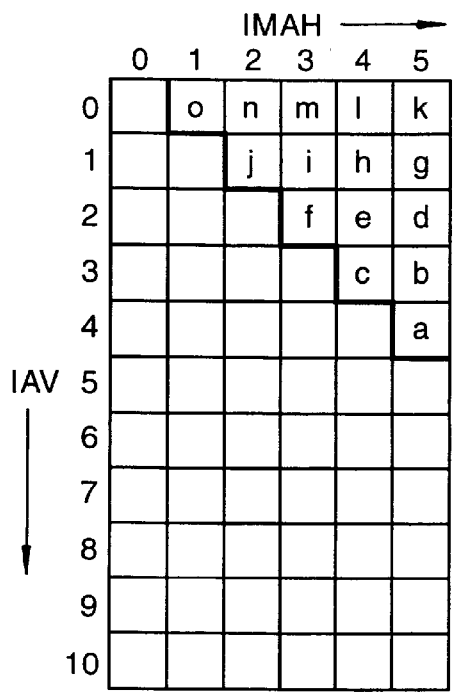
FIG. 3B is a diagram illustrating a memory mapping in accordance with the intermediate address generated from the address generating unit in FIG. 2.

FIG. 3B describes a method of mapping for optimizing the usage of memory according to the present invention by utilizing an intermediate address generated by an intermediate address converter 23-2 in FIG. 2. The 15 register groups (this is displayed by a~o) with the basic horizontal group address MAH (6~10) are mapped to the vacant locations in the the basic horizontal group address MAH (0~5). The 15 groups moved in FIG. 3B are described by the identical alphabet (a~o) marked in FIG. 3A. The intermediate vertical address IAV zero (0) to 10 is to select one of the vertical ends of the memory, and the intermediate horizontal group address IMAH zero (0) to 5 and the horizontal cell address LAH zero (0) to 16 are to select one of the horizontal memory cells. By the memory mapping as shown in FIG. 3B, the SRAM 22 needs only the minimal amount of 66 register groups (=(B−1)×(B/2)), each of which comprises 17 bytes (=M). As a result, it enables to perform the convolutional interleaving without a waste of memory.

Figure 4:
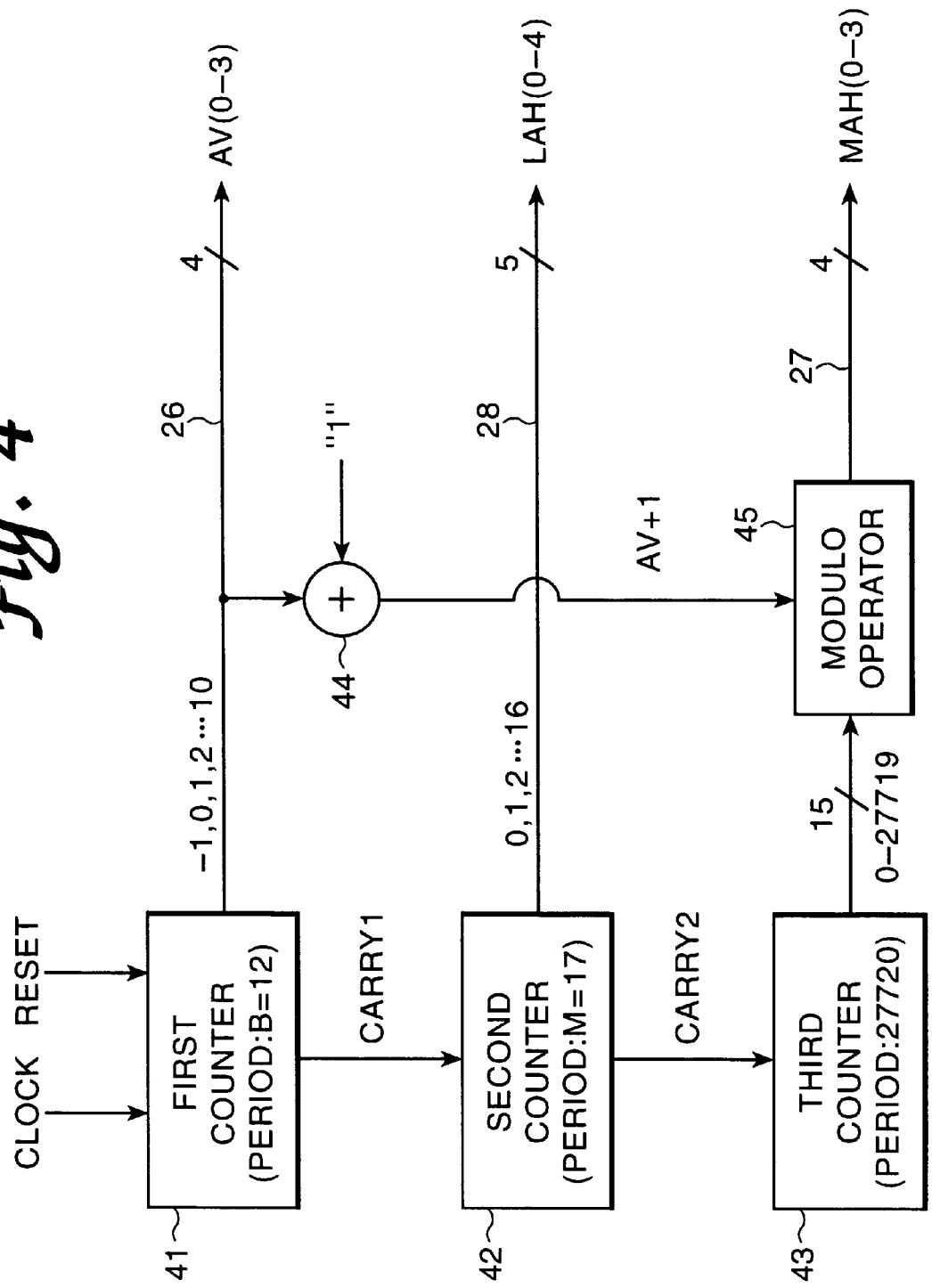
FIG. 4 is a detailed diagram illustrating a basic address generator in FIG. 2.

FIG. 4 is a detailed diagram illustrating a basic address generator 23-1 in FIG. 2. The generator comprises a first counter 41, a second counter 42, a third counter 43, an accumulator 44, and a modulo operator 45.

FIG. 5A to FIG. 5I are timing diagrams showing the operation of a convolutional interleaver shown in FIG. 2. Here, FIG. 5A shows a byte clock signal, and FIG. 5B shows an input data stream D(k, i), ith data of kth period, to be inputted to the input buffer 21 in synchronization with the byte clock signal.

FIG. 5C shows an enable signal IN_ENA from the controller 25 to the input buffer 21, which has low level at the first clock of 12 clock period monitoring the basic vertical address signal AV, and has high level during the former half period and low level during the latter half period of the remaining 11 clocks.

FIG. 5D shows an output data from the input buffer 21, in which the first data is loaded on the data bus during the total period of the first byte clock, after one clock delay by the input buffer enable signal IN_ENA, and the remaining 11 data are loaded on the data bus during the latter half period of the remaining clocks.

FIG. 5E shows a read enable signal READ from the controller 25 to the SRAM 22, which has high level at the first clock monitoring the basic vertical address signal AV, and low level during the former half period and high level during the latter half period of the remaining 11 clocks.

FIG. 5F shows a write enable signal WRITE from the controller 25 to the SRAM 22, which has high level at the first clock monitoring the basic vertical address signal AV, and high level during the former half period and low level during the latter half period of the remaining 11 clocks.

FIG. 5G shows an address data loaded on the address bus for accessing the SRAM 22. A physical address (PA, 31) supplied from the address generating unit 23 is maintained during one clock period in the remaining 11 clocks, except for the first clock of 12 clock period.

FIG. 5H shows a data loaded on the data bus, in which the data D(k, i) is loaded on the data bus during the first clock period and the latter half period of the remaining 11 clocks. The output data M(k, i), read from the SRAM 22 according to the physical address PA, is loaded on the data bus during the former half period of the remaining 11 clocks.

FIG. 5I shows an output data from the output buffer 24, in which the data from the input buffer 21 at the first clock is directly outputted, and the data read from the SRAM 22 is outputted at the remaining 11 clocks.

Hereinafter, a preferred embodiment in accordance with the present invention is described in detail.

As shown in FIG. 2, the input buffer 21 latches the input data (in bytes) and outputs the input data to a data bus according to the input buffer enable signal IN_ENA. The data on the data bus is stored in the corresponding cell in the SRAM 22 according to the physical address PA, 31 from the address generating unit 23 and the write enable signal WRITE from the controller 25. The data stored in the SRAM 22 is read from the corresponding cell in the SRAM 22 according to the physical address PA, 31 from the address generating unit 23 and the read enable signal READ from the controller 25, and is outputted to the data bus. The output buffer 24 latches and outputs the data on the data bus according to the output buffer enable signal OUT_ENA supplied from the controller 25.

In the preferred embodiment of the present invention, the read operation of the SRAM 22 is implemented during the former half period of the clocks and the write operation for storing the input data loaded on the data bus to the SRAM 22 is processed during the latter half period of the clocks.

The controller 25 supplies the read enable signal READ to the SRAM 22 and the output buffer enable signal OUT_ ENA to the output buffer 24 according to the basic vertical address (AV, 26) obtained from the basic address generator 23-1, during the former half period of each clock.

In the address generating unit 23, the basic address generator 23-1 is reset by the reset signal, and generates the basic vertical address (AV, 26), the basic horizontal group address (MAH, 27) and the horizontal cell address (LAH, 28) for mapping the basic memory having B−1 number of vertical ends with a horizontal cell length of (B−1)×M as shown in FIG. 3A.

The intermediate address converter 23-2 converts the basic vertical address (AV, 26) and the basic horizontal group address (MAH, 27) obtained from the basic address generator 23-1 into the intermediate vertical address (IAV, 29) and intermediate horizontal group address (IMAH, 30), respectively, for mapping the intermediate memory having B−1 number of vertical ends with a horizontal cell length of (B/2)×M. In the physical address mapper 23-3, the intermediate vertical address (IAV, 29) and the intermediate horizontal group address (IMAH, 30) supplied from the intermediate address converter 23-2, and the horizontal cell address (LAH, 28) supplied from the basic address generator 23-1 are supplied, such that the one dimensional physical address (PA, 31) for accessing the SRAM 22 is obtained.

The convolutional interleaver reads the data stored in the corresponding storage location of the memory, indicated by physical address (PA, 31) to be provided to the data bus during the former half period of each clock, and stores the current data in the same storage location during the latter half period. The physical address (PA, 31) of the memory is constant for one clock and indicates the identical basic vertical address (AV, 26) on the interleaving levels (B=12 clock). But, the basic horizontal group address (MAH, 27) and the horizontal cell address (LAH, 28) are changed according to the basic vertical address AV. That is, a changing period of the horizontal group address MAH depends on the basic vertical address AV.

The changing period of the basic horizontal group address (MAH,27) has the periodic function corresponding to the length of the shift registers in FIG. 1.

The table 1 is used for describing the changing period of the basic horizontal group address (MAH, 27).

TABLE 1

The changing period of the basic horizontal group address MAH according to the basic vertical address AV.

| BASIC VERTICAL ADDRESS (AV) | BASIC HORIZONTAL GROUP ADDRESS (MAH) |
|---|---|
| −1 | UNUSED |
| 0 | 0, 0, 0, 0, 0, 0, . . . |
| 1 | 0, 1, 0, 1, 0, 1, 0 . . . |
| 2 | 0, 1, 2, 0, 1, 2, 0, 1, 2, . . . |
| . | . |
| . | . |
| . | . |
| 8 | 0, 1, 2, 3, 4, 5, 6, 7, 8, 0, 1, 2, 3 . . . |
| 9 | 0, 1, 2, 3, 4, 5, 6, 7, 8, 9, 0, 1, 2, 3 . . . |
| 10 | 0, 1, 2, 3, 4, 5, 6, 7, 8, 9, 10, 0, 1, 2, 3 . . . |

The table 1 shows the basic vertical address AV=−1 for the first data D(k, 0) of the 12 clock period, AV=0 for storing the second data D(k, 1), and AV=1 for storing the third data D(k, 2). In the table 1, the basic vertical address increases by 1 unit for each clock, to be outputted as −1, 0, 1, . . . , 10, −1, 0, 1. The basic horizontal group address MAH increases by 1 unit after 17 number of ith data of the 12 clock period is inputted (that is, the moment the horizontal cell address LAH becomes 0 again after each period of 0 to 16). As a result, the basic horizontal group address MAH is changed periodically according to the basic vertical address AV and the horizontal cell address LAH.

The basic address generator 23-1 according to the present invention, for generating the basic vertical address (AV), the basic horizontal group address MAH, and the horizontal cell address (LAH), as shown above, is described in detail referring to FIG. 4.

A first counter 41, reset by the reset signal and synchronized with the byte clock of the system, repeatedly counts −1, 0, 1, 2, ..., 10 by increments of 1 unit from the initial value −1 with a first counting period B=12). The counting value of the first counter 41 corresponds to the basic vertical address (AV, 26) of 4 bits. A second counter 42 begins to count upon receiving a first carry signal CARRY1 from the first counter 41, from the initial value 0 to 16 by increments of 1 unit with a second counting period (M=17). The counting value of the second counter 42 corresponds to the horizontal cell address (LAH, 28) of 5 bits.

Similarly, a third counter 43 begins to count upon receiving a second carry signal CARRY2 from the second counter 42, from the initial value 0 to 27719 during 27720, that is, the lowest common multiply (LCM) for the integral numbers to 1~11 clock period. Here, 27720 is a recursive period used for generating the basic horizontal group address in the modulo operator 45.

An accumulator 44 adds value 1 to the basic vertical address (AV, 26), and a modulo operator 45 modulo-operates the counting value of the third counter 43 by the output value from the accumulator 44. The value outputted from the modulo operator 45 corresponds to the basic horizontal group address (MAH, 27).

Referring to FIG. 2, the basic addresses 26, 27, and 28, indicated in the figure, are converted to one dimensional physical address PA for accessing the SRAM 22.

The intermediate vertical address IAV and the intermediate horizontal group address IMAH are calculated according to the basic vertical address AV and the basic horizontal group address MAH, at the intermediate address converter 23-2 by utilizing the following mathematical expressions 2 and 3.

MATHEMATICAL EXPRESSION 2

$IAV=AV, (0 \leq MAH < B/2)$
$IAV=(B-2)-AV, (B/2 \leq MAH)$

MATHEMATICAL EXPRESSION 3

$IMAH=MAH, (0 \leq MAH < B/2)$
$IMAH=(B-1)-MAH, (B/2 \leq MAH)$

The two dimensional intermediate vertical address (IAV, 29) and intermediate horizontal group address (IMAH, 30) correspond to the address indicating each group cell in the intermediate memory when group cells of a basic memory in FIG. 3A, that is, a,b,c, ... ,n,o are moved as shown in FIG. 3B.

The two dimensional intermediate vertical address (IAV, 29) and intermediate horizontal group address (IMAH, 30) and the horizontal cell address (IMAH, 28) are further mapped to one dimensional physical address (PA, 31) for accessing the intermediate memory in FIG. 3B, at the physical address mapper 23-3.

The rule allocating the physical address (PA, 31) for scanning the memory cell array in FIG. 3B vertically or horizontally is described by the following mathematical expressions 4A and 4B.

MATHEMATICAL EXPRESSION 4A $PA=(IMAH \times M+LAH) \times (B-1)+IAV$: ADDRESS SCANNED VERTICALLY

MATHEMATICAL EXPRESSION 4B $PA=(IAV \times B/2 \times M \times IMAH) \times M+LAH$: ADDRESS SCANNED HORIZONTALLY The intermediate address converter 23-2 and the physical address mapper 23-3 implementing the above mathematical expressions are easily realized with well-known accumulators and calculators. Here, the interleaving level B and the number of registers belong to one register group, that is M (=N/B, where N is the number of data belong to one data stream) are a predetermined constant value, respectively.

The controller 25 receives the basic vertical address (AV, 26) from the basic address generator 23-1 to generate the input buffer enable signal IN_ENA, the read enable signal READ for SRAM 22, the write enable signal WRITE, and the output buffer enable signal OUT_ENA.

That is, the controller 25 monitors the basic vertical address (AV, 26) and determines the interleaving level (B=12) to generate a control signal according to the clocks.

FIG. 5A to FIG. 5I are explained in detail below when the control signal from the controller 25 is an active low signal.

When the data D(k,0) is inputted to the input buffer 21 in synchronization with the first clock of 12 clock period, the data D(k,0) is directly outputted to the output buffer 24, bypassing the SRAM 22. The input buffer enable signal IN_ENA in FIG. 5C, during the second clock, delayed one clock at the input, indicates low level for outputting the data of FIG. 5B from input buffer 21 to the data bus as shown in FIG. 5D. Simultaneously, the read enable signal READ of FIG. 5E and the write enable signal WRITE of FIG. 5F indicate high level to disable SRAM 22. The output buffer enable signal OUT_ENA indicates low level, and the output buffer 24 latches and outputs the first data D(k, 0) loaded on the data bus as shown in FIG. 5I.

The remaining data [D(k, 1)~D(k, 11)], except the first data D(k, 0) of the 12 clock period, must be stored in SRAM 22 and outputted after some delay. Accordingly, when the data D(k, 1) is inputted to the input buffer 21 in synchronization with the second clock of the 12 clock period of FIG. 5A, the write enable signal WRITE of FIG. 5F indicates high level and the read enable signal READ of FIG. 5E indicates low level for reading the previous input data M(k, 1) stored in the physical address PA of FIG. 5G in SRAM 22, during the former half period of the third clock. The input buffer enable signal IN_ENA of FIG. 5C indicates low level to load the input data D(k, 1) on the data bus, during the latter half period of the third clock. The read enable signal READ of FIG. 5E indicates high level and the write enable signal WRITE of FIG. 5F indicates low level, for storing the current data D(k,1) in the identical storage location of the physical address of FIG. 5G. And, the output buffer enable signal OUT_ENA is changed to low level for latching the previous data M(k, 1) from the SRAM 22 loaded on the data bus of FIG. 5H, is during the former half period of the third clock.

During the process of the remaining data [D(k,2)~D(k, 11)], the control signals having the same constant level as those used during the process of the second data D(k,1) are continuously generated for controlling the input buffer 21, the SRAM 22, and the output buffer 24.

In brief, the first input data D(k, 0) of the 12 clock period is directly outputted from the output buffer 24, bypassing SRAM 22. The data [D(k, 1)~D(k, 11)] are stored in SRAM 22 according to the physical address PA supplied from the address generating unit 23 for a predetermined delay. At this point, according to the physical address PA maintained during one clock period, the previous input data M(k,1)~M (k,11) stored in SRAM 22 is outputted during the former half period of each clock, and the current input data D(k,1)~D (k,11) is stored in SRAM 22 during the latter half period of each clock.

As described above, according to the present invention, it enables the amount of memory to be used in the convolutional interleaving process to be reduced to a minimal amount of memory required theoretically by using an SRAM as the memory and the optimum method for generating the memory address.

While this invention has been described in connection with what is presently considered to be the most practical and preferred embodiments, it is to be understood that the invention is not limited to the disclosed embodiment, but, on the contrary, it is intended to cover various modifications and equivalent arrangements included within the spirit and scope of the appended claims.

What is claimed is:

1. A convolutional interleaver for interleaving a data stream composed of N number of consecutive data with an interleaving level B to randomize the data stream for error correction, comprising:

input means for inputting the data stream and outputting a first data of the interleaving level during a first clock and a second to a Bth data of the interleaving level during one half period of a second to a Bth clock, respectively;

storage means having a structure of an intermediate memory having B−1 number of vertical ends with a horizontal cell length of (B/2)×M modified from a structure of a basic memory having B−1 number of vertical ends with a horizontal cell length of (B−1)×M by moving some of used storage locations into all of unused storage locations in the basic memory, where M=N/B, said storage means for performing a read operation during one half period of a clock for which a physical address is maintained, and for performing a write operation during the other half period of said clock for which a physical address is maintained;

address generating means for generating the physical address to access said intermediate memory;

output means for outputting the data from said input means during the first clock and the data from said storage means during each of a second to a Bth clock, respectively; and a controller for receiving a basic vertical address from said address generating means and generating a plurality of control signals for controlling said input means, said output means, and said storage means.

2. The convolutional interleaver according to claim 1, wherein said address generating means comprises;

a basic address generator for generating a basic vertical address, a basic horizontal group address and a horizontal cell address to access said basic memory;

an intermediate address converter for converting said basic vertical address and said basic horizontal group address to an intermediate vertical address and an intermediate horizontal group address to access said intermediate memory; and a physical address mapper for generating the physical address by using the intermediate vertical address, the intermediate horizontal group address, and the horizontal cell address.

3. The convolutional interleaver according to claim 2, wherein said basic address generator comprises;

a first counter for repeatedly counting from an initial value '−1' to 'B−2' by increments of 1 in synchronization with a byte clock and outputting the counted value as the basic vertical address;

a second counter for being initiated by a first carry signal from said first counter, repeatedly counting from an initial value '0' to 'M−1' by increments of 1 and outputting the counted value as the horizontal cell address;

a third counter for being initiated by a second carry signal from said second counter, repeatedly counting from an initial value '0' to a 'LCM', where 'LCM' is the lowest common multiply for the the integral number to 1~(B−1), and outputting the counted value as a recursive period to generate the basic memory address;

an accumulator for adding 1 to said basic vertical address; and a modulo operator for modulo-operating the counted value from said third counter with the output value of said accumulator and outputting the obtained value as the basic horizontal group address.

4. The convolutional interleaver according to claim 1, wherein said physical address is maintained during one clock, a previous data is read from a position corresponding to the physical address in said storage means during one half period of each clock and a current data from said input means is stored in the same position corresponding to the physical address in said storage means during the other half period of each clock.

5. A method for generating a memory address to interleave a data stream composed of N number of consecutive data with an interleaving level B, comprising the steps of;

(a) disabling a memory access in a first clock of the interleaving level for a first data of B period;

(b) generating a basic vertical address for selecting one of (B−1) number of vertical ends in a basic memory having B−1 number of vertical ends with a horizontal length cell of (B−1)×M to delay the remaining data except the first data of B period, a basic horizontal group address for selecting one of (B−1) number of horizontal groups in the basic memory, and a horizontal cell address for selecting one of M number of cells in one of the horizontal groups in the basic memory, where M=N/B;

(c) converting the basic vertical address in said (b) step to an intermediate vertical address for selecting one of (B−1) number of vertical ends of an intermediate memory having B−1 number of vertical ends with a horizontal length cell of (B/2)×M, and the basic horizontal group address in said (b) step to an intermediate horizontal group address for selecting one of (B/2) number of the horizontal groups of said intermediate memory;

(d) generating a physical address for accessing said intermediate memory by using the intermediate vertical address and intermediate horizontal group address in said (c) step, and the horizontal cell address in said (b) step; and (e) maintaining said physical address in said (d) step during one clock while reading the data during one half period of the clock and writing the data during the other half period of the clock.

6. The method for generating a memory address according to claim 5, wherein in said step (b), the basic vertical address is generated by repeatedly counting from an initial value '−1' to 'B−2', the horizontal cell address is generated by repeatedly counting from an initial value '0' to 'M−1', and the basic horizontal group address is generated by modulo-operating the counted value obtained by repeatedly counting from an initial value '0' to LCM, where LCM is the lowest common multiply for the integral number to 1~(B−1), with the value obtained by adding 1 to the basic vertical address.

7. The method for generating a memory address according to claim 5, wherein in said (c) step, the intermediate vertical address is IAV=AV when the basic horizontal group address is 0≦MAH<B/2, while converted to IAV=(B−2)-AV when B/2≦MAH, the intermediate horizontal group address is IMAH=MAH when the basic horizontal group address is 0≦MAH<B/2, while converted to IMAH=(B−1)-MAH when B/2≦MAH.

8. The method for generating a memory address according to claim 5, wherein in said (d) step, the physical address PA=(IMAH×M+LAH)×(B−1)+IAV when the intermediate memory is scanned in vertical direction, while transformed to PA=(IAV×B/2×M+IMAH)×M+LAH when the intermediate memory is scanned in horizontal direction.

\* \* \* \* \*